United States Patent [19]

Stewart

[11] 3,967,295
[45] June 29, 1976

[54] INPUT TRANSIENT PROTECTION FOR INTEGRATED CIRCUIT ELEMENT

[75] Inventor: Roger Green Stewart, Neshanic Station, N.J.

[73] Assignee: RCA Corporation, New York, N.Y.

[22] Filed: Apr. 3, 1975

[21] Appl. No.: 564,911

[52] U.S. Cl. .................................. 357/51; 357/23; 357/41; 357/42; 307/202 R; 307/304
[51] Int. Cl.² .................. H01L 27/02; H01L 29/78; H02H 7/20; H03K 3/353
[58] Field of Search .................. 357/23, 14, 41, 51, 357/42; 338/20, 21, 308, 309, 314, 333; 307/202, 237, 304

[56] References Cited
UNITED STATES PATENTS

| | | | |
|---|---|---|---|
| 3,590,340 | 6/1971 | Kubo et al. | 357/41 |
| 3,615,932 | 10/1971 | Makimoto et al. | 357/51 |
| 3,629,782 | 12/1971 | Sahni | 357/51 |
| 3,667,009 | 5/1972 | Rugg | 357/40 |
| 3,673,428 | 6/1972 | Athanas | 357/51 |
| 3,712,995 | 1/1973 | Steudel | 357/40 |
| 3,748,547 | 7/1973 | Sugimoto | 357/41 |
| 3,754,171 | 8/1973 | Anzai et al. | 357/13 |
| 3,934,159 | 1/1976 | Nomiya et al. | 357/41 |

OTHER PUBLICATIONS

RCA Cos/Mos Integrated Circuits Manual, (3/1971), p. 55, RCA Solid State Division, Somerville, N.J.
R. S. Samson, "Obtaining High Resistance in Integrated Circuits", IBM Technical Disclosure Bulletin, vol. 13, (1/1971), p. 2151.

*Primary Examiner*—William D. Larkins
*Assistant Examiner*—Gene M. Munson
*Attorney, Agent, or Firm*—H. Christoffersen; R. P. Williams; Sanford J. Asman

[57] ABSTRACT

In an integrated circuit which includes an element which is subject to destructive breakdown upon the application thereto of a high voltage, means including a semiconductor current limiting resistor bounded by a PN junction is formed in the device and coupled between a conductor and the circuit element. One end of the current limiting resistor is coupled to the conductor and has a configuration such that a distributed resistance is included within the resistor between the conductor and the PN junction boundary of the resistor, to protect the PN junction bounding the resistor.

3 Claims, 3 Drawing Figures

INPUT TRANSIENT PROTECTION FOR INTEGRATED CIRCUIT ELEMENT

This invention was made in the course of or under a contract or subcontract thereunder with the Department of the Army.

This invention relates to integrated circuit devices and pertains in particular to the protection of circuit elements in integrated circuit devices from destructive breakdown due to high voltage signals.

One kind of integrated circuit device in which the present protection means may be used includes insulated gate field effect transistors as circuit elements. Each transistor includes a gate insulator, which is usually thermally grown silicon dioxide, disposed on a surface of the device and covered by a gate electrode. A well-known problem with these gate insulators is their relative sensitivity to high voltage transient signals. Voltages of destructive magnitude are difficult to avoid during manufacturing, testing, assembling, or other handling of these devices. Voltages much higher are often produced by simple electrostatic charge accumulation on the human body.

A known protection scheme for insulated gate field effect transistors includes a current limiting resistor connected between the gate insulator to be protected and a conductor, such as a terminal of the device, to which a high voltage signal may be applied. A protective diode is connected across the gate insulator to be protected such that the maximum voltage which can be impressed across the gate insulator is limited to the reverse breakdown voltage of this diode. In so-called CMOS integrated circuit devices, where both N channel and P channel insulated gate field effect transistors are used, a diode has been included across each kind of transistor, and in some circuits the diodes have operated in the forward direction to limit the voltage applied across the transistor gate insulators.

The current limiting resistor in prior devices has usually been a semiconductor resistor comprising a region which forms a PN junction with the surrounding material of the semiconductor body. This PN junction may itself perform the function of the protective diode or it may be coupled to a PN junction having a different breakdown characteristic. In either case, the part of the PN junction near the input end of the current limiting resistor has itself been subject to destructive breakdown. Consequently, even though adequate protection has been provided for the gate insulators, the devices have been rendered useless by reason of destruction of the protection devices themselves.

Figure 1:
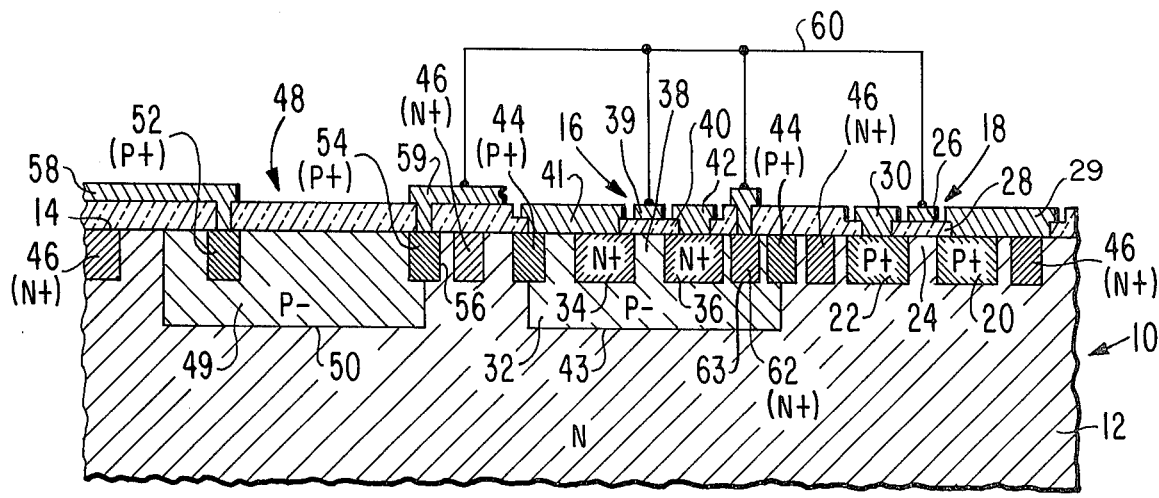
FIG. 1 is a diagrammatic cross-section of an integrated circuit device which includes the present novel protection means.

An integrated circuit device which includes the present novel protective means is indicated at 10 in the drawings. The device 10 may be made by conventional processes in a body 12 of semiconductive material, usually silicon, which has a surface 14 adjacent to which are a plurality of regions making up active and passive circuit elements.

Regions are formed adjacent to the surface 14 to define an N channel insulated gate field effect transistor 16 and a P channel insulated gate field effect transistor 18. In this example the body 12 is initially of one type conductivity, e.g. N type, throughout its volume. Regions 20 and 22 of P+ type conductivity are in the body 12 adjacent to the surface 14 and define the source and drain regions for the transistor 18. Between the regions 20 and 22 is a channel region 24, the conductivity of which may be controlled by a gate electrode 26 overlying the channel 24 and spaced therefrom by an insulator 28. Electrodes 29 and 30 make contact to the regions 20 and 22 respectively and may serve to connect these regions to other regions in the device 10.

The N channel transistor 16 requires a substrate of conductivity type opposite to that of the body 12. For this purpose, there is a well region 32, of P type conductivity in this example. N+ type source and drain regions 34 and 36, respectively, are in the well region 32 and are spaced from each other to define a channel region 38. A gate electrode 39 overlies the channel region 38 and is separated therefrom by a gate insulator 40. A source electrode 41 and a drain electrode 42 make contact to the source region 34 and the drain region 36, respectively.

Isolation between the transistors 16 and 18 is provided in part by a PN junction 43 at the boundary between the P well 32 and the surrounding material of the body 12. This junction 43 may be reverse biased during operation of the device 10. In addition, guardbands, which are highly doped regions adjacent to the surface 14, may be employed to act as surface channel stoppers in known fashion. Typical P+ type guardbands are indicated at 44 in FIG. 1 adjacent to the edge of the P well 32. N+ type guardbands are shown at 46. An N+ type guardband 46 surrounds the transistor 18. Other N+ type guardbands may have other locations in the device 10 and may for example surround the present novel protective means as will be discussed below. Either P type or N type guardbands may be used wherever there is a danger of parasitic action due to surface channeling, as is generally known. Moreover, the guardbands may be used in establishing ohmic contact to the body 12 and to the well region 32 in known manner. Thus, the source electrode 29 of the transistor 18 may contact an adjacent N+ type guardband 46 and the source electrode 41 of the transistor 16 may contact an adjacent P+ type guardband 44, as shown in FIG. 1.

The gate insulators 28 and 40 of the transistors 18 and 16, respectively, are usually made of thermally grown silicon dioxide having a thickness of about 1000A. The breakdown strength of this material is about $10^7$ volts/cm and consequently any voltage on the respective gate electrodes in excess of about 100 volts will probably cause breakdown of the oxide.

Means are provided to protect the gate insulators against breakdown due to relatively high voltages and in the present example this means is shown at 48 in the drawings. The protective means 48 includes a region 49, of P type conductivity in this example, in the body 12 adjacent to the surface 14. The region 49 is relatively lightly doped and defines with the material of the body 12 a PN junction 50 which, because of the depth and light doping profile of the region 49, has a relatively high reverse breakdown voltage characteristic.

Means are also provided to make ohmic contact with different portions of the region 49, and the region 49 is shaped to define a resistor in the space between these portions. Included in the contact means are zones 52 and 54 of relatively high P+ type conductivity, each of which is in ohmic contact with a portion of the region 49. The zone 52 is disposed entirely within the region 49 for a purpose which will be explained below. The zone 54, on the other hand, is formed in overlapping relation to an edge of the region 49 and defines with the surrounding material of the body 12, a second PN junction 56. In other words, the zone 54 constitutes a means adjacent to a first portion of the region 49 for coupling the region 49 to the surrounding material of the body 12 through the second PN junction 56. The concentration of impurities in the zone 54 is much higher than the concentration in the region 49 so that the reverse breakdown strength of the second PN junction 56 is substantially lower than that of the first PN junction 50 and so that the forward turnover time of the second PN junction 56 is relatively short.

The zone 52 acts as a means making ohmic contact to a second portion of the region 49 and serves to facilitate an ohmic connection between the region 49 and a conductor 58. A conductor 59 is connected to the other P+ type zone 54 and this conductor is connected to the gate electrodes overlying the gate insulators which are to be protected. This latter connection is diagramatically shown in FIG. 1 by a conductor 60 extending from the conductor 59 to the gate electrodes 39 and 26. The conductor 60 is also connected to an N+ type region 62 in the P well 32 forming a PN junction 63.

Figure 2:
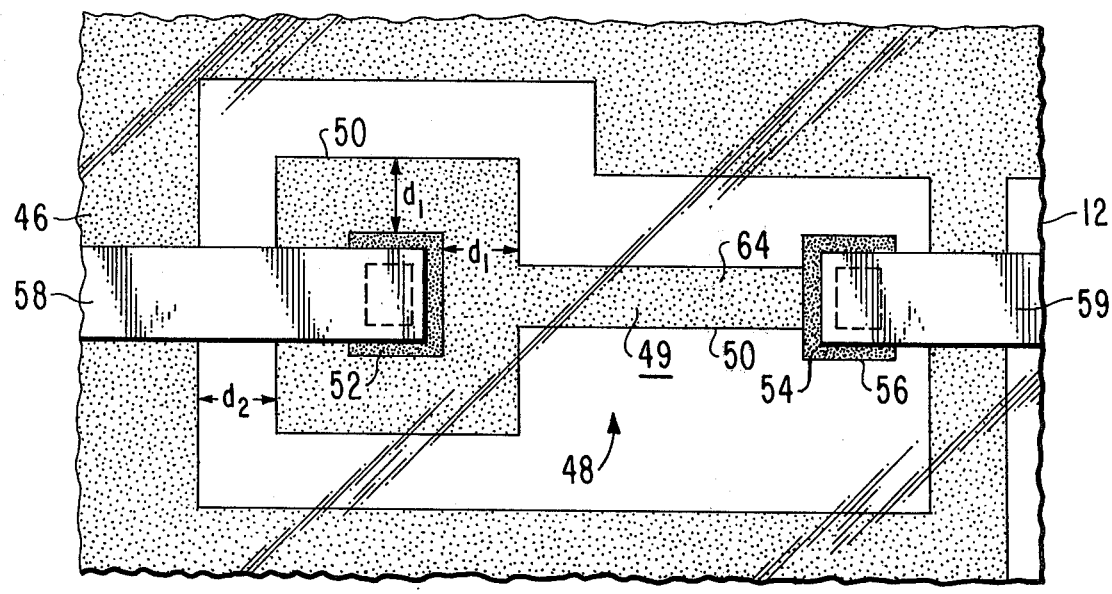
FIG. 2 is an enlarged diagrammatic plan view of the protective means shown in cross-section in FIG. 1.

A typical configuration of the region 49 is shown in plan view in FIG. 2. The region 49 has an elongated, relatively narrow portion 64 in this example, the length and width of which define the value of the resistor. The length and width of the portion 64 are a matter of choice.

At that portion of the region 49 which is contacted by the zone 52 there is a substantial spacing between the periphery of the zone 52 and the surface intercept of the PN junction 50 with the surface 14. Stated differently, the zone 52 is located within the boundary of the surface intercept of the PN junction 50 by a substantial amount, indicated as $d_1$ in FIG. 2. This distance should be made constant around substantially all of the first zone 52, when the resistor portion 64 of the region 49 is relatively narrow as shown. In any case, there should be a relatively large minimum amount of separation between the zone 52 and the PN junction 50. Moreover, the zone 52 should be substantially more shallow than the region 49 so that there is also a significant spacing between the zone 52 and the PN junction 50 in the direction normal to the surface 14. This has the purpose of placing a significant distributed resistance between the zone 52 and the PN junction 50 in all directions within the body 12. This distributed resistance acts as ballasting resistance to protect the PN junction 50 against destructive breakdown currents.

Substantial space should also be left between the PN junction 50 and any surrounding region, such as the surrounding N+ type guardband region 46 shown in FIGS. 1 and 2. The region 46 will ordinarily be connected to a relatively high potential, either directly or through the body 12, and the PN junction 50 should be spaced from this resultant source of potential by a distributed resistance similar to that surrounding the zone 52. Thus, there should be a minimum spacing, shown as $d_2$, between the PN junction 50 and any surrounding region such as the region 46. The values permissible for the spacings $d_1$ and $d_2$ will vary as a function of the depths and doping profiles of the various regions. The spacings should be designed to be large enough to provide significant distributed resistance but should be kept to a minimum so as not to occupy an unduly large area on the surface of the device 10. Within the guidelines of this application, suitable spacings may be determined by experimentation for a given device structure.

In one example, a resistor having a value of about 1100 ohms may have the following structure when the body 12 is of N type conductivity with a background concentration of donor impurities of about $3 \times 10^{15}$ per $cm^3$ and the region 49 is a diffused P type region having a depth of about 9 micrometers ($\mu$m) and a maximum surface concentration of acceptors of about $5 \times 10^{16}$ per $cm^3$, giving a sheet resistivity of about 700 ohms per square. The length and width of the portion 64 of the region 49 may be 2.7 mil (about 8.5 $\mu$m) by 2.0 mil (about 50.8 $\mu$m). This provides a resistance slightly less than 1100 ohms since some resistance will be added to the resistance of the portion 64 by the material of the region 49 between the zone 52 and the end of the portion 64. The zones 52 and 54 may have identical areas of 1.0 mil (about 25.4 $\mu$m) by 1.6 mil (about 40.6 $\mu$m). The distance $d_1$ may be 0.8 mil (about 21 $\mu$m) and the distance $d_2$ may be 3.6 mil (about 91.5 $\mu$m).

Figure 3:
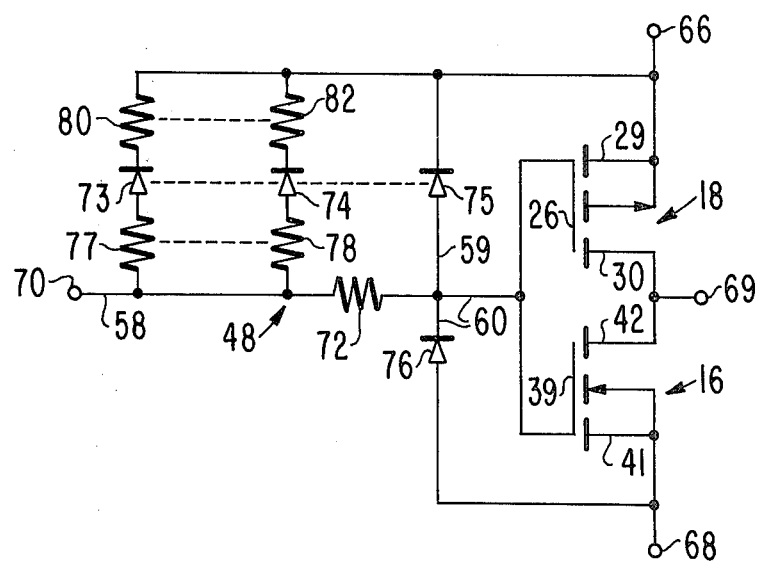
FIG. 3 is a schematic representation of a typical CMOS integrated circuit device provided with the present novel protective means.

FIG. 3 is a schematic equivalent circuit of the present novel device, showing a typical connection of the transistors 16 and 18. In FIG. 3, the two transistors 16 and 18 are shown as connected in series between a terminal 66 and a terminal 68. For this purpose, the source electrode 29 of the transistor 18 may be connected in known fashion to a terminal represented by the terminal 66 and the source electrode 41 of the transistor 16 may be connected to the terminal 68. The body 12 and the well region 32 are also connected to the terminals 66 and 68, respectively by the electrodes 29 and 41. The drain electrodes 30 and 42 of the transistors 16 and 18 may be connected together and to a terminal 69. The present novel protective means 48 may be connected via the conductor 58 to a terminal 70. By means of the conductors 59 and 60, the protective means 48 may be connected to the gates 26 and 39 in a manner similar to the protective circuits in known structures. The protective means 48 is also connected to the terminals 66 and 68 through the material of the body 12 and the well region 32, similar to the relationship in known structures.

The resistance of the region 49 is represented in FIG. 3 by a resistor 72 connected between the terminal 70 and the gates 26 and 39. The PN junctions 50 and 56 of the device 10 provide a distributed diode represented in FIG. 3 by diodes 73, 74 and 75 connected together by a dashed line. The anodes of these diodes, i.e. the material of the region 49, and the zone 54 are coupled to the resistor 72. The cathodes, the material of the body 12, are coupled to the terminal 66. The PN junction 63 defined by the P well 32 and the N+ type region 62 is represented by a diode 76 in FIG. 3. The anode of this diode is effectively connected to the terminal 68 via the electrode 41 and the cathode is connected to the gates 26 and 39 to be protected and to the resistor 72 via the conductors 59 and 60.

The distributed resistor provided by the spacing $d_1$ between the zone 52 and the PN junction 50 is represented in FIG. 3 by resistances 77 and 78 joined by a dashed line, connected between one end of the resistor 72 and the anodes of the diodes 73 and 74. The distributed resistance provided by the spacing $d_2$ between the PN junctions 50 and any surrounding N+ material connected to the terminal 66 is indicated by resistances 80 and 82 joined by a dashed line, connected between the cathodes of the diodes 73 and 74 and the terminal 66.

In the operation of the present device, signals may be applied to the terminal 70 and will be transmitted with some decrease in voltage owing to the resistor 72, to the gates 26 and 39. During normal operation, the several diodes in the protective means 48 will be either zero biased or reversed biased to a level below their normal breakdown potential. Ordinarily, the terminal 66 is connected to a relatively high potential, known as $V_{DD}$ and the terminal 68 is connected to a relatively low potential, known as $V_{SS}$. The input signal applied to the terminal 70 is either $V_{DD}$ or $V_{SS}$ in normal operation. If the input voltage should rise above $V_{DD}$ for some reason, the diode 75 will be forward biased and will conduct so as to limit the voltage applied to the gates 26 and 39 to one forward voltage drop above $V_{DD}$. If the input should go below $V_{SS}$, the diode 76 will be forward biased to limit the voltage on the gates 26 and 39 to one forward voltage drop below $V_{SS}$. However, under conditions of extremely high transient voltage in the direction which reverse biases the PN junctions 50 and 56, the PN junction 50 can break down in the reverse direction because under transient conditions, the magnitude of the voltage across the portion of the junction 50 nearer to the zone 52 may be greater than that across the junction 50 adjacent to the zone 54, owing to the transient voltage drop along the region 49. The distributed resistances provided by the spacings $d_1$ and $d_2$ protect the portion of the PN junction 50 near the zone 52 by limiting the current density across any individual portion of the PN junction 50 and by acting to distribute or maintain constant, or nearly so, the breakdown currents through each portion of the PN junction 50. In other words, the junction 50 may break down in the present device but owing to the ballasting and current limiting action provided by the distributed resistances around the zone 52, the breakdown is less likely to be destructive.

Semiconductor resistors are generally known in which enlarged portions are provided at each end where contact is to be made. In known structures, these enlarged portions are ordinarily used merely to facilitate making contact to the resistor and there is no significant ballasting between the contact and the surrounding PN junction. In the present device, the spacing between the contact means and the PN junction at the input end of the resistor is sufficiently large to provide distributed ballasting resistors, and destructive breakdown is less likely to occur with this structure. The resistor described in the above example can successfully withstand voltages up to 290 volts and can dissipate power up to 1450 watts when operated by a pulsed source. A similar resistor without input ballasting can withstand only 140 volts and can dissipate only 56 watts before destruction.

What is claimed is:

1. A semiconductor device comprising:
   a. a body of semiconductor material of one conductivity type, said body having a surface;
   b. a first region extending into said body from said surface and forming a first PN junction with the surrounding portions of said body;
   c. a first zone of the same type as and of higher degree of conductivity than the remainder of said first region extending into said surface at one end of said first region and forming a second PN junction with the portions of said body adjacent said first zone;
   d. a second zone of the same type as and of higher degree of conductivity than the remainder of said first region extending into said surface within said first region, said second zone being spaced from said first zone, all parts of said second zone being surrounded on said surface by material of said first region over at least a first predetermined distance along said surface from said first PN junction, whereby there is a first resistance between said first zone and said second zone and a first distributed ballasting resistance between said second zone and said first PN junction;
   e. a second region extending into the surface of said body of the same conductivity type as said body and of higher conductivity than said body, all parts of said second region being at least a second predetermined distance along said surface from said second zone, whereby there will be a second distributed ballasting resistance between those parts of said first PN junction which surround said second zone and said second region;
   f. first contact means making ohmic contact to said first zone; and
   g. second contact means making ohmic contact to said second zone, whereby said first resistance is between said first contact means and said second contact means, said first ballasting resistance is between said second contact means and one side of said first PN junction, said second ballasting resistance is between the other side of said first PN junction and said second region, and said second PN junction is between said first contact means and said second region.

2. The semiconductor device of claim 1 further comprising conductor means and circuit elements, said first contact means being electrically connected to at least one circuit element and said second contact means being electrically connected to said conductor means.

3. The semiconductor device of claim 1 further comprising conductor means electrically contacting said first contact means.

* * * * *